(12) United States Patent
Rachmady et al.

(10) Patent No.: US 7,700,470 B2
(45) Date of Patent: Apr. 20, 2010

(54) SELECTIVE ANISOTROPIC WET ETCHING OF WORKFUNCTION METAL FOR SEMICONDUCTOR DEVICES

(75) Inventors: Willy Rachmady, Beaverton, OR (US); Uday Shah, Portland, OR (US); Jack T. Kavalieros, Portland, OR (US); Brian S. Doyle, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 551 days.

(21) Appl. No.: 11/525,765

(22) Filed: Sep. 22, 2006

(65) Prior Publication Data

US 2008/0073723 A1 Mar. 27, 2008

(51) Int. Cl.
*H01L 21/3205* (2006.01)
*H01L 21/4763* (2006.01)

(52) U.S. Cl. .......... 438/585; 257/69; 257/204; 257/E27.046; 257/E27.064; 257/E21.63

(58) Field of Classification Search ......... 438/141, 438/153–158, 188, 189, 199–209, 274–279, 438/585; 257/758, 69, 204, E27.046, E27.064, 257/E27.108, E21.632
See application file for complete search history.

(56) References Cited

U.S. PATENT DOCUMENTS

| | | | |
|---|---|---|---|
| 5,640,049 A * | 6/1997 | Rostoker et al. ............ 257/758 |
| 5,731,232 A * | 3/1998 | Wuu et al. ................. 438/153 |
| 5,804,848 A | 9/1998 | Mukai |
| 5,844,278 A | 12/1998 | Mizuno et al. |
| 5,899,710 A | 5/1999 | Mukai |
| 6,018,176 A | 1/2000 | Lim |
| 6,027,961 A * | 2/2000 | Maiti et al. ............... 438/199 |
| 6,066,869 A | 5/2000 | Noble et al. |
| 6,413,802 B1 | 7/2002 | Hu et al. |
| 6,459,123 B1 | 10/2002 | Enders et al. |
| 6,472,258 B1 | 10/2002 | Adkisson et al. |
| 6,525,403 B2 | 2/2003 | Inaba et al. |
| 6,562,665 B1 | 5/2003 | Yu |
| 6,583,469 B1 | 6/2003 | Fried et al. |
| 6,611,029 B1 | 8/2003 | Ahmed et al. |
| 6,630,388 B2 | 10/2003 | Sekigawa et al. |
| 6,635,909 B2 | 10/2003 | Clark et al. |
| 6,642,090 B1 | 11/2003 | Fried et al. |
| 6,657,259 B2 | 12/2003 | Fried et al. |
| 6,689,650 B2 | 2/2004 | Gambino et al. |
| 6,770,516 B2 | 8/2004 | Wu et al. |
| 6,787,402 B1 | 9/2004 | Yu |
| 6,794,718 B2 | 9/2004 | Nowak et al. |
| 6,798,000 B2 | 9/2004 | Luyken et al. |
| 6,800,910 B2 | 10/2004 | Lin et al. |

(Continued)

OTHER PUBLICATIONS

Y. Choi et al., "Sub-20nm CMOS FinFET Technologies", IEEE, 2001, pp. 19.1.1-19.1.4.

(Continued)

*Primary Examiner*—Sue Purvis
*Assistant Examiner*—Monica D Harrison
(74) *Attorney, Agent, or Firm*—Kenneth A. Nelson (57) ABSTRACT

Embodiments of an apparatus and methods for providing a workfunction metal gate electrode on a substrate with doped metal oxide semiconductor structures are generally described herein. Other embodiments may be described and claimed.

19 Claims, 6 Drawing Sheets

U.S. PATENT DOCUMENTS

| | | |
|---|---|---|
| 6,803,631 B2 | 10/2004 | Dakshina-Murthy et al. |
| 6,812,075 B2 | 11/2004 | Fried et al. |
| 6,815,277 B2 | 11/2004 | Fried et al. |
| 6,821,834 B2 | 11/2004 | Ando |
| 6,833,588 B2 | 12/2004 | Yu et al. |
| 6,835,614 B2 | 12/2004 | Hanafi et al. |
| 6,849,884 B2 | 2/2005 | Clark et al. |
| 6,869,868 B2 | 3/2005 | Chiu et al. |
| 6,885,055 B2 | 4/2005 | Lee |
| 6,897,527 B2 | 5/2005 | Dakshina-Murthy et al. |
| 7,495,290 B2 * | 2/2009 | Li ............................ 257/369 |
| 2007/0052037 A1 * | 3/2007 | Luan .......................... 257/369 |

OTHER PUBLICATIONS

J. Park et al., "Pi-Gate SOI MOSFET", IEEE Electron Device Letters, vol. 22, No. 8, Aug. 2001, pp. 405-406.

Willy Rachmady et al., "Tri-Gate Device with Conformal PVD Workfunction Metal on Its Three-Dimensional Body and . . . ", U.S. Appl. No. 11/418,295, filed May 3, 2006.

Uday Shah et al., "A Sacrificial Oxide Layer Which Enables Spacer Over-Etch in Tri-Gate Architectures", U.S. Appl. No. 11/479,713, filed Jun. 30, 2006.

* cited by examiner

SELECTIVE ANISOTROPIC WET ETCHING OF WORKFUNCTION METAL FOR SEMICONDUCTOR DEVICES

FIELD OF THE INVENTION

The field of invention relates generally to the field of semiconductor integrated circuit manufacturing and, more specifically but not exclusively, relates to planar and three-dimensional complementary metal oxide semiconductor (CMOS) devices comprising a workfunction metal with a columnar microstructure.

BACKGROUND INFORMATION

In a conventional metal oxide semiconductor field effect transistor (MOSFET), the source, channel, and drain structures are constructed adjacent to each other within the same plane. Typically, a gate dielectric is formed on the channel area and a gate electrode is deposited on the gate dielectric. The transistor is controlled by applying a voltage to the gate electrode, thereby allowing a current to flow through the channel between source and drain.

An alternative to methods of building planar MOSFETs has been proposed to help alleviate some of the physical barriers to scaling down existing designs. The alternative method involves the construction of three dimensional MOSFETs, in the form of a multi-gate transistor such as a dual-gate field effect transistor (FinFET) or a tri-gate transistor field effect transistor, as a replacement for the conventional planar MOSFET.

Three-dimensional transistor designs such as the FinFET and the tri-gate field effect transistor allow tighter packing of the same number of transistors on a semiconductor chip by using vertical or angled surfaces for the gates. A tri-gate field effect transistor comprises three equal length gates situated on three exposed surfaces of a body whereas a FinFET comprises two equal length gates situated along the sides of a narrow body, or fin.

The gate electrode is commonly formed on the gate dielectric using a doped polysilicon layer, one or more metal layers, or a combination of polysilicon and metal layers. The gate electrode may be capped with dielectric layer to mask and protect the structure during front-end processing. The width of the gate electrode structure and regions of isolation between the gate electrodes is commonly miniaturized to provide a greater density of gates per unit area. Deviations in the profile of the gate structure where the cross-section of the gate structure is either flared or notched may lead to reduced device performance or operational failure of one or more transistors.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION

In various embodiments, an apparatus and methods relating to a workfunction metal gate electrode on a substrate with doped metal oxide semiconductor structures are described. In the following description, various embodiments will be described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 1:
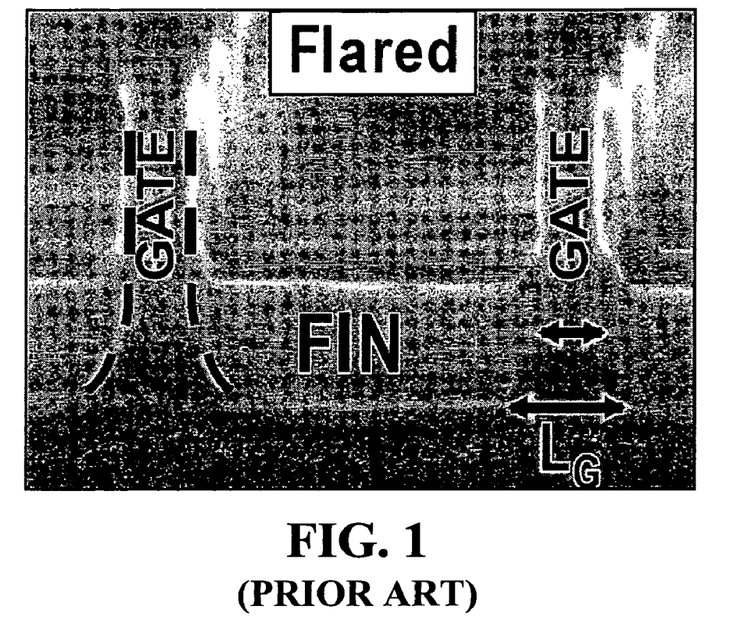
FIG. 1 (PRIOR ART) is an illustration of a prior art device with a flared gate sidewall profile.
Figure 2:
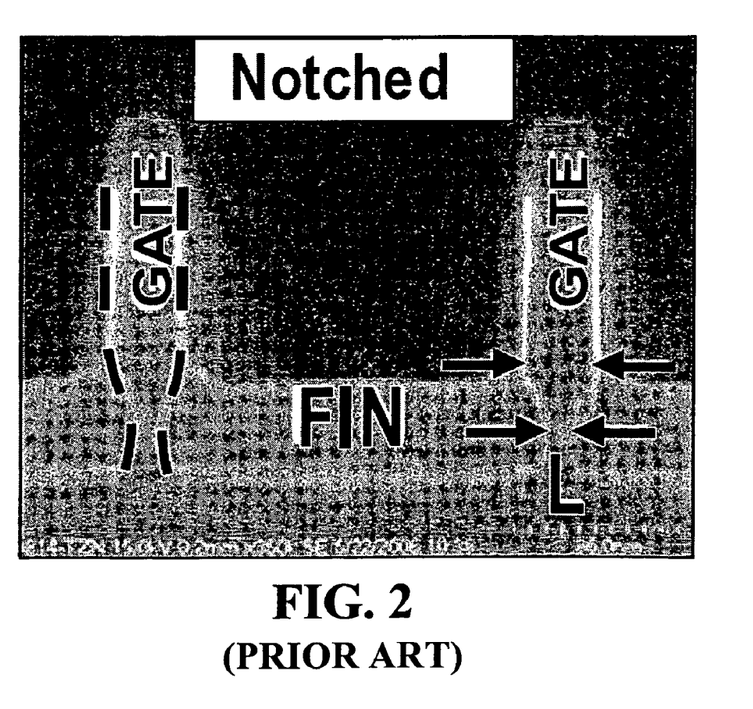
FIG. 2 (PRIOR ART) is an illustration of a prior art device with a notched gate sidewall profile.

FIG. 1 (PRIOR ART) is an illustration of a prior art device with a flared gate sidewall profile. The illustration provides an example of how a FinFET with a workfunction metal and polysilicon gate electrode fabricated with prior art methods may provide a gate with a thick workfunction metal section, resulting in a flared gate sidewall profile. FIG. 2 (PRIOR ART) is an illustration of a prior art device with a notched gate sidewall profile. The illustration provides an example of how a FinFET with a workfunction metal and polysilicon gate electrode fabricated with prior art methods may provide a gate with a thin workfunction metal section, resulting in a notched gate sidewall profile.

Figure 3:
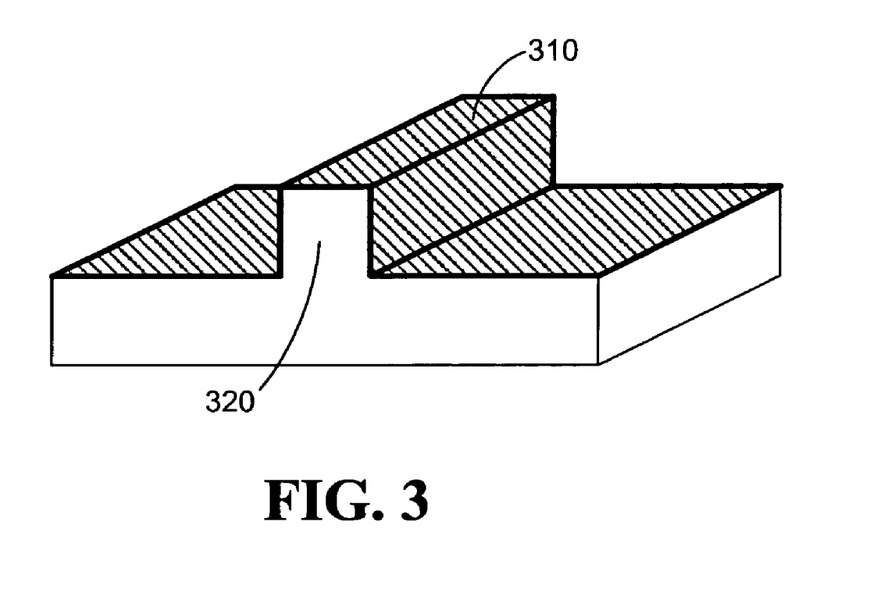
FIG. 3 is an illustration of a multi-gate transistor after depositing a dielectric layer on a body.

The illustration in FIG. 3 is a pictorial view of a multi-gate transistor after depositing a dielectric layer 310 on a body 320. The multi-gate transistor in FIG. 3 is a tri-gate transistor with three equal length gates. In another embodiment the multi-gate transistor is a dual-gate field effect transistor (FinFET) with two gates. The dielectric layer may comprise at least one of silicon oxide or a high-K material. The high-K material comprises at least one of lanthanum oxide, tantalum oxide, titanium oxide, hafnium oxide, zirconium oxide, lead-zirconate-titanate, barium-strontium-titanate, or aluminum oxide. The dielectric layer 310 is deposited as a conformal layer on the body 320 using methods known to persons having ordinary skill in the art, such as plasma enhanced chemical vapor deposition (PECVD), high density chemical vapor deposition (HDCVD), molecular organic chemical vapor deposition (MOCVD), Atomic Layer Deposition (ALD), or sputtering. The body 320 may comprise silicon, Germanium, or III-V semiconductor such as gallium arsenide (GaAs) and indium antimonide (InSb). The body 320 may be formed from an epitaxial layer, a monocrystalline substrate or from a silicon-on-insulator (SOI) layer.

Figure 4:
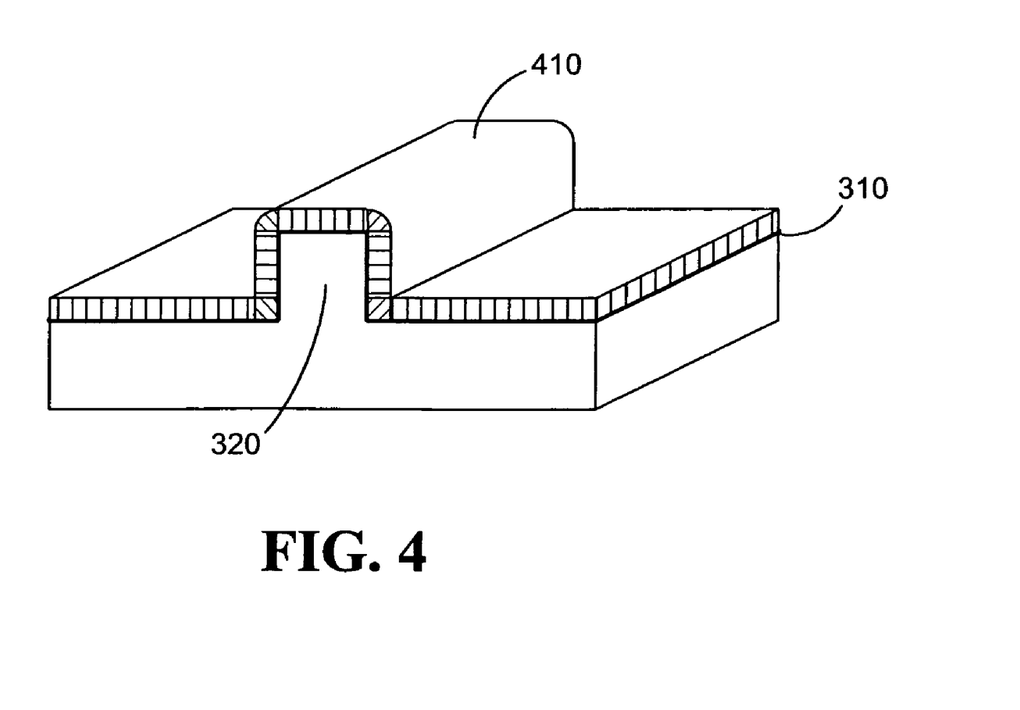
FIG. 4 illustrates the transistor in FIG. 3 after depositing a workfunction metal layer on the dielectric layer.

The illustration in FIG. 4 depicts the multi-gate transistor in FIG. 3 after depositing a conformal workfunction metal layer 410 on the dielectric layer 310. A workfunction metal is a metal with a known work function, which is an inherent characteristic of the metal expressed in units of electron volts (eV). In one embodiment, the workfunction metal layer 410 comprises at least one of titanium nitride, tantalum nitride, or another transition nitride metal. A workfunction metal layer thickness is a function of the targeted threshold voltage ($V_t$) for the multi-gate device.

In one embodiment, the workfunction metal layer is formed using a directional sensitive physical vapor deposition (PVD) process. Deposition of the workfunction metal layer 410 using the PVD process is characterized by a microstructure that comprises columnar grains that nucleate at a surface and grow normal to the surface. In another embodiment, a workfunction metal layer 410 with columnar grains may be formed using layering techniques including molecular beam epitaxy (MBE), chemical vapor deposition (CVD), electroplating, or evaporation.

Figure 5:
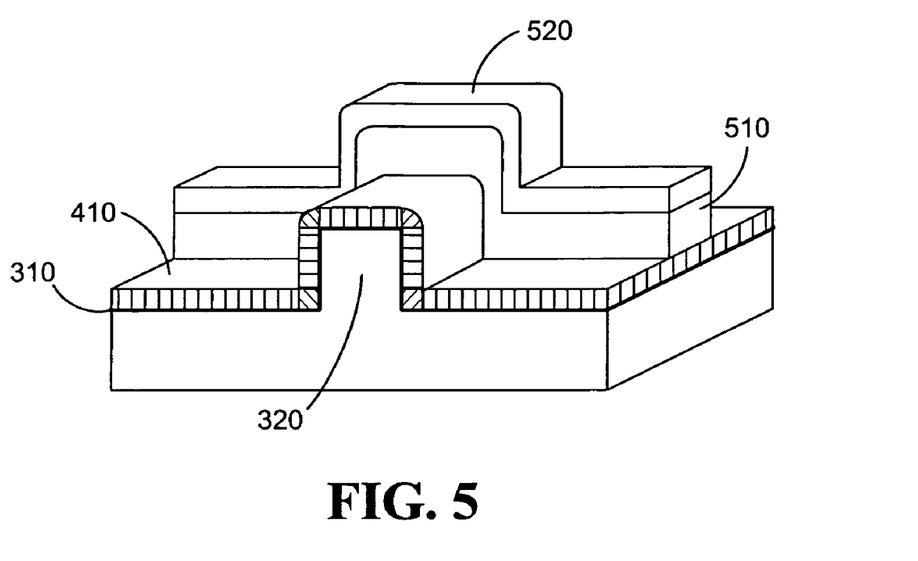
FIG. 5 illustrates the transistor in FIG. 4 after forming a protective mask on the workfunction metal layer.

FIG. 5 illustrates the multi-gate transistor in FIG. 4 after forming a protective mask, comprising polysilicon 510 and a hard mask 520, on a portion of the workfunction metal layer 410. The protective mask is formed by a series of deposition, lithography, and etch processes known to one ordinarily skilled in the art. The formation of the protective mask creates a protected region and an exposed region. The protected region is covered by the overlying protective mask while the exposed region is left exposed and is not covered by the overlying protective mask. The polysilicon 510 may be doped or un-doped and the hard mask 520 may comprise silicon nitride or silicon oxynitride.

Figure 6:
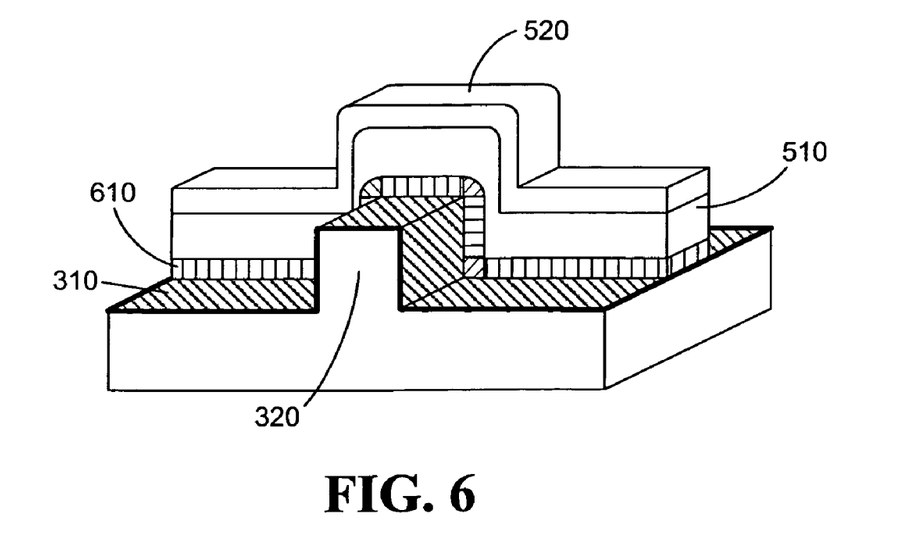
FIG. 6 illustrates the transistor in FIG. 5 after anisotropically etching the workfunction metal layer to form a gate electrode.

FIG. 6 illustrates the multi-gate transistor in FIG. 5 after anisotropically etching an exposed region of the workfunction metal layer 410. The exposed region of the workfunction metal layer 410 is etched using a wet etch process utilizing a wet-etchant comprising a base and an oxidant. The appropriate wet-etch process is selectively designed to etch the workfunction metal layer 410 without significantly eroding the polysilicon 510 or the hard mask 520, to form a gate electrode 610 with a hard mask 520. The base may comprise at least one of ammonium hydroxide ($NH_4OH$), tetramethylammonium hydroxide (TMAH), or potassium hydroxide (KOH). The oxidant may comprise at least one of hydrogen peroxide ($H_2O_2$) or ozone ($O_3$). The workfunction metal layer 410 is etched anisotropically, meaning that an etch rate in the direction normal to a surface is much higher than in a direction parallel to the surface. The workfunction metal layer 410 etches anisotropically because an etch rate of the workfunction metal layer 410 in a direction normal to the gate surface is much faster than an etch rate of the workfunction metal layer 410 in a direction parallel to the gate surface. This allows protected regions of the workfunction metal layer 410 to remain largely intact while the exposed regions of the workfunction metal layer 410 are etched by the wet-etchant.

Figure 7:
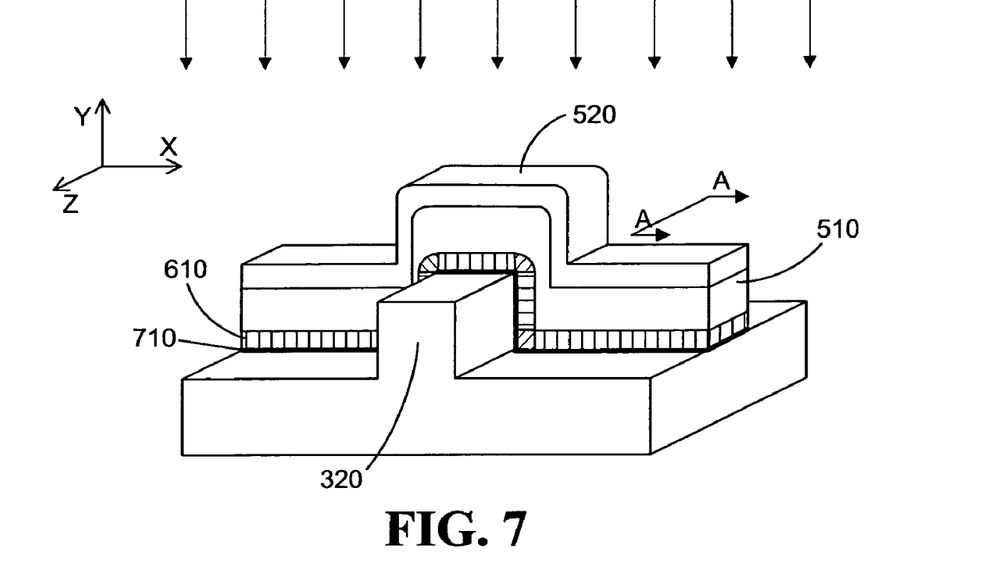
FIG. 7 illustrates the transistor in FIG. 6 after anisotropically etching the dielectric layer to form a gate dielectric.

FIG. 7 illustrates the multi-gate transistor of FIG. 6 after etching the dielectric layer 310 to form a gate dielectric 710. In one embodiment, the first dielectric layer 310 is eroded anisotropically using a dry-etch process such as sulfur hexafluoride (SF6), oxygen (O2), carbon monoxide (CO), and argon (Ar), or a fluorinated hydrocarbon ($CH_xF_y$) gas in a MERIE or an ECR chamber or tool. In another embodiment, the dielectric layer 310 may be eroded using a wet-etch process or an ion milling process.

Figure 7A:
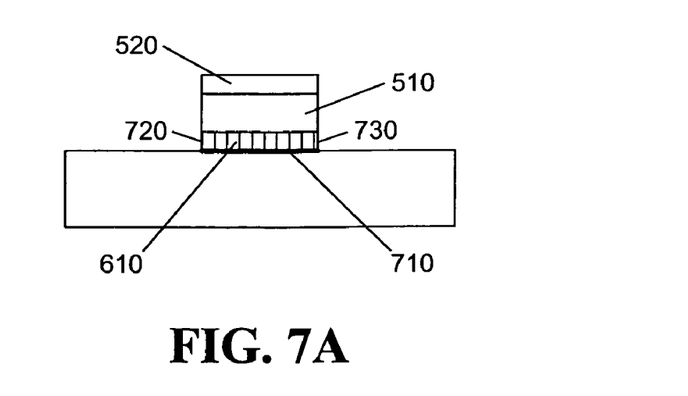
FIG. 7A is cross-sectional view of FIG. 7 taken through section line A-A of a Y-Z plane illustrating the sidewalls of the gate electrode.
Figure 8:
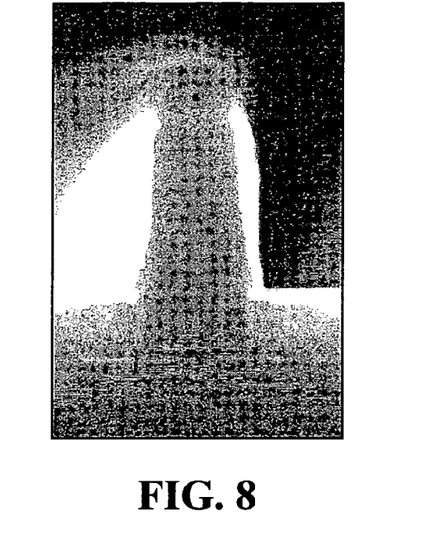
FIG. 8 is an illustration of an embodiment of the current invention with a substantially parallel sidewall profile.

FIG. 7A is cross-sectional view of FIG. 7 taken through section line A-A of a Y-Z plane illustrating a first sidewall 720 and a second sidewall 730 of the gate electrode 610. The anisotropic wet etch process forms each sidewall effectively along a same X-Y plane as the polysilicon 510, the hard mask 520, and the gate dielectric 710, creating a substantially parallel sidewall profile. FIG. 8 is an illustration of an embodiment of the current invention with a substantially parallel sidewall profile.

Figure 9:
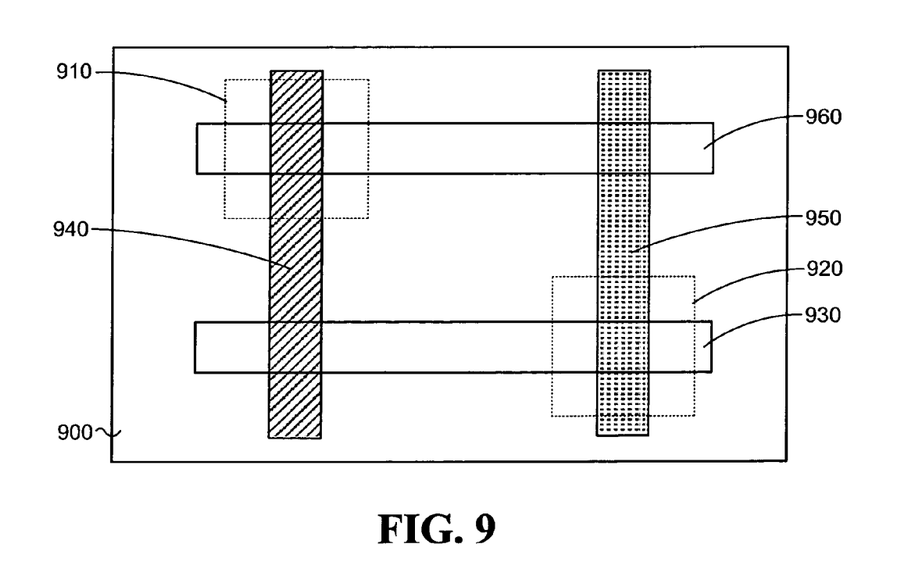
FIG. 9 is an illustration of a top view of a logic area comprising an n-channel metal oxide semiconductor and a p-channel metal oxide semiconductor.

The illustration in FIG. 9 is a top view of a logic area 900 comprising one or more n-channel metal oxide semiconductor (NMOS) field effect transistors 910 and one or more p-channel metal oxide semiconductor (PMOS) field effect transistors 920. An NMOS field effect transistor 910 may comprise a first gate electrode 940 on a first body 960. A PMOS field effect transistor 920 may comprise a second gate electrode 950 on a second body 930.

In one embodiment, the NMOS field effect transistor 910 and the PMOS field effect transistor 920 may be a three-dimensional multi-gate transistor as described in United States Patent Publication No. US 2005/0156171 A1 (Jul. 21, 2005). The publication describes the fabrication of a three-dimensional transistor known as a tri-gate transistor, consists which of three gates. As described therein a semiconductor body having a top surface and first and second laterally opposite sidewalls are formed on an insulating substrate. A gate electrode and a gate dielectric are formed on the top surface of the semiconductor body and on the first and second laterally opposite sidewalls of the semiconductor body. A pair of source and drain regions are formed in the semiconductor body on opposite sides of the gate electrode. In another embodiment, the NMOS field effect transistor 910 and the PMOS field effect transistor 920 may comprise two gates, commonly known as a dual-gate transistor. In an additional embodiment, the NMOS field effect transistor 910 and the PMOS field effect transistor 920 may be a planar structure using fabrication methods commonly known to one skilled in the art.

Figure 10:
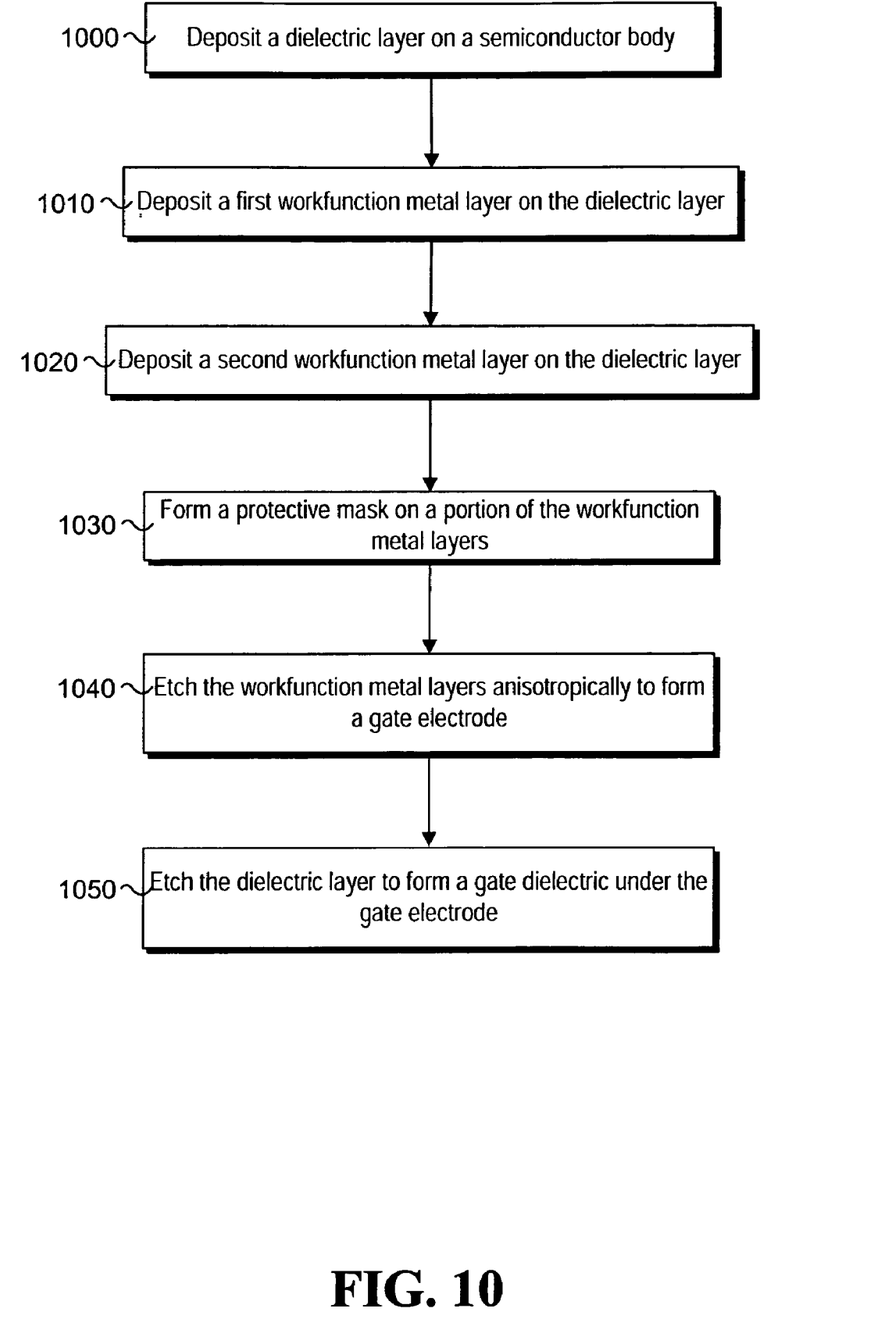
FIG. 10 is a flowchart describing one embodiment of a fabrication process used to form a CMOS device comprising a workfunction metal with a columnar microstructure.

FIG. 10 is a flowchart describing one embodiment of a fabrication process used to form a CMOS device comprising a workfunction metal with a columnar microstructure. The process is initiated (element 1000) by depositing a dielectric layer 310 on a body 320. The dielectric layer 310 is deposited as a conformal layer on the body 320 using methods such as PECVD, HDCVD, or sputtering. The dielectric layer may comprise at least one of silicon oxide or a high-K material. The high-K material comprises at least one of lanthanum oxide, tantalum oxide, titanium oxide, hafnium oxide, zirconium oxide, lead-zirconate-titanate, barium-strontium-titanate, or aluminum oxide.

A first workfunction metal layer 410 is deposited on the dielectric layer 310 (element 1010) to form a first gate electrode 940. The workfunction metal layer 410 may be formed using a directional sensitive physical vapor deposition (PVD) process resulting in a microstructure that comprises columnar grains that seed at a surface and grow normal to the surface. Alternatively, the workfunction metal layer may be formed using layering techniques including molecular beam epitaxy (MBE), chemical vapor deposition (CVD), electroplating, or evaporation. A second workfunction metal layer is deposited on the dielectric layer 310 (element 1020) to form a second gate electrode 950.

A protective mask is formed on a portion of the workfunction metal layer 410 (element 1030) using methods known to one skilled in the art. The protective mask may comprise at least one of polysilicon 510 and a hard mask 520. The polysilicon 510 may be doped or un-doped and the hard mask 520 may comprise silicon nitride or silicon oxynitride.

The workfunction metal layer 410 is etched anisotropically with a wet-etchant comprising a base and an oxidant to form a gate electrode 610 on the dielectric layer 310 (element 1040). The base may comprise at least one of ammonium hydroxide ($NH_4OH$), tetramethylammonium hydroxide (TMAH), or potassium hydroxide (KOH). The oxidant may comprise at least one of hydrogen peroxide ($H_2O_2$) or ozone ($O_3$). The workfunction metal layer 410 etches anisotropically because an etch rate of the workfunction metal layer 410 in a direction normal to the gate surface is much faster than an etch rate of the workfunction metal layer 410 in a direction parallel to the gate surface. This allows protected regions of the workfunction metal layer 410 to remain largely intact while the exposed regions of the workfunction metal layer 410 are etched by the wet-etchant.

The dielectric layer 310 is etched to form a gate dielectric 710 under the gate electrode 610 (element 1050). In one embodiment, the dielectric layer 310 is eroded anisotropically using a dry-etch process such as sulfur hexafluoride (SF6), oxygen (O2), carbon monoxide (CO), and argon (Ar), or a fluorinated hydrocarbon (CHxFy) gas in a MERIE or an ECR chamber or tool. In another embodiment, the dielectric layer 310 may be eroded using a wet-etch process or an ion milling process.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for fabricating a multi-gate transistor comprising:
   providing a body having side surfaces and a top surface;
   depositing a dielectric layer on the side surfaces and on the top surface of the body;
   depositing a workfunction metal layer on the dielectric layer;
   forming a protective mask on a portion of the workfunction metal layer;
   anisotropically etching the workfunction metal layer with a wet-etchant to form a gate electrode; and
   etching the dielectric layer to form a gate dielectric such that the gate dielectric occurs only under the gate electrode.

2. The method of claim 1, wherein the dielectric layer is selected from the group consisting of silicon oxide, lanthanum oxide, tantalum oxide, titanium oxide, hafnium oxide, zirconium oxide, lead-zirconate-titanate, barium-strontium-titanate, and aluminum oxide.

3. The method of claim 1, wherein etching the dielectric layer using at least one of a dry-etch process or an ion milling process.

4. The method of claim 1, wherein the body is selected from the group consisting of silicon, gallium-arsenide, and indium antimonide.

5. The method of claim 1, wherein the workfunction metal layer is selected from the group consisting of titanium nitride, tantalum nitride, and another transition nitride metal.

6. The method of claim 1, wherein the protective mask is selected from the group consisting of un-doped polysilicon, doped polysilicon, silicon nitride, and silicon oxynitride.

7. The method of claim 1, wherein the wet-etchant comprises a base and an oxidant.

8. The method of claim 7, wherein the base comprises at least one of ammonium hydroxide, tetramethylammonium hydroxide, and potassium hydroxide.

9. The method of claim 7, wherein the oxidant comprises at least one of hydrogen peroxide and ozone.

10. A method of fabricating a multi-gate transistor, comprising:
    depositing a dielectric layer on a top surface and on side surfaces of a body;
    depositing a first workfunction metal layer and a second workfunction metal layer on the dielectric layer;
    forming a protective mask on the workfunction metal layers leaving protected regions and exposed regions;
    forming a gate electrode by anisotropically wet-etching the exposed regions of the workfunction metal layers and leaving exposed regions of the dielectric layer; and etching the exposed regions of the dielectric layer to form a gate dielectric such that the gate dielectric occurs only under the gate electrode.

11. The method of claim 10, wherein the multi-gate transistor is a dual-gate transistor or a tri-gate transistor.

12. The method of claim 10, wherein the dielectric layer is selected from the group consisting of silicon oxide, lanthanum oxide, tantalum oxide, titanium oxide, hafnium oxide, zirconium oxide, lead-zirconate-titanate, barium-strontium-titanate, and aluminum oxide.

13. The method of claim 10, wherein etching the dielectric layer using at least one of a dry-etch process and an ion milling process.

14. The method of claim 10, wherein the body is selected from the group consisting of silicon, gallium-arsenide, and indium antimonide.

15. The method of claim 10, wherein the workfunction metal layer comprises at least one of titanium nitride, tantalum nitride, and another transition nitride metal.

16. The method of claim 10, wherein the protective mask comprises at least one of un-doped polysilicon, doped polysilicon, silicon nitride, and silicon oxynitride.

17. The method of claim 10, wherein the exposed region of the workfunction metal layer is wet-etched with a solution comprising a base and an oxidant.

18. The method of claim 17, wherein the base comprises at least one of ammonium hydroxide, tetramethylammonium hydroxide, and potassium hydroxide.

19. The method of claim 17, wherein the oxidant comprises at least one of hydrogen peroxide and ozone.

* * * * *